United States Patent
Koutny et al.

(10) Patent No.: US 6,811,831 B1
(45) Date of Patent: Nov. 2, 2004

(54) METHOD FOR DEPOSITING SILICON NITRIDE

(75) Inventors: William C. Koutny, Santa Clara, CA (US); Helen L. Chung, Santa Clara, CA (US)

(73) Assignee: Silicon Magnetic Systems, San Jose, CA (US)

( * ) Notice: Subject to any disclaimer, the term of this patent is extended or adjusted under 35 U.S.C. 154(b) by 0 days.

(21) Appl. No.: 10/300,137

(22) Filed: Nov. 20, 2002

(51) Int. Cl.$^7$ .................................................. H05H 1/24
(52) U.S. Cl. ........................................ 427/578; 427/579
(58) Field of Search ................................ 427/578, 579

(56) References Cited

U.S. PATENT DOCUMENTS

| | | | | |
|---|---|---|---|---|
| 4,992,299 A | * | 2/1991 | Hochberg et al. | 427/579 |
| 5,773,100 A | * | 6/1998 | Chang et al. | 427/579 |
| 6,040,022 A | * | 3/2000 | Chang et al. | 427/579 |
| 6,176,978 B1 | | 1/2001 | Ngan | |
| 6,197,167 B1 | | 3/2001 | Tanaka | |
| 6,346,302 B2 | * | 2/2002 | Kishimoto et al. | 427/569 |
| 6,358,573 B1 | * | 3/2002 | Raoux et al. | 427/578 |

* cited by examiner

Primary Examiner—Bret Chen
(74) Attorney, Agent, or Firm—Kevin I. Daffer; Mollie E. Lettang; Conley Rose P.C.

(57) ABSTRACT

A method is provided which includes creating a plasma from a gas mixture including diatomic nitrogen gas and a gas comprising silicon. In addition, the method includes exposing a microelectronic topography to the plasma to form a silicon nitride layer thereon. In some cases, the method may include forming the silicon nitride layer at a temperature less than approximately 300° C. Furthermore, the method may include subsequently processing the microelectronic topography at a temperature greater than or equal to approximately 250° C. such that a stress change of less than approximately $1.0 \times 10^{10}$ dynes/cm$^2$ occurs within the silicon nitride layer. In addition, a microelectronic topography is provided which has a silicon nitride layer with a concentration of diatomic hydrogen that is at least one order of magnitude lower than a concentration of diatomic hydrogen within a silicon nitride layer formed from a plasma generated from ammonia.

20 Claims, 1 Drawing Sheet

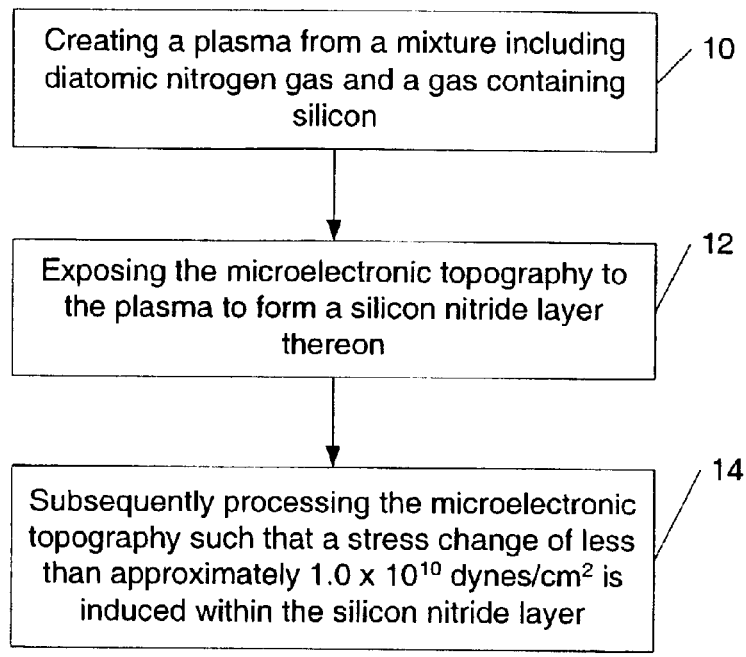
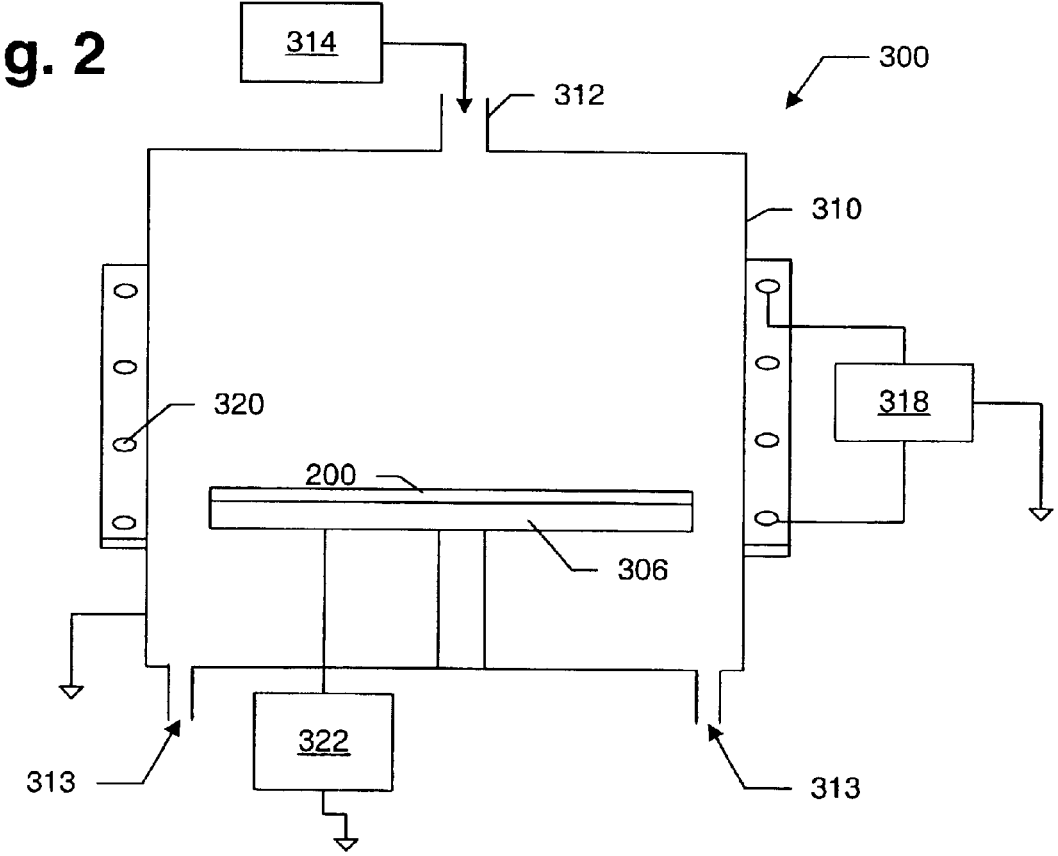

METHOD FOR DEPOSITING SILICON NITRIDE

BACKGROUND OF THE INVENTION

1. Field of the Invention

This invention relates to integrated circuit fabrication and, more particularly, to silicon nitride deposition techniques.

2. Description of the Related Art

The following descriptions and examples are given as background information only.

Silicon nitride layers are commonly fabricated within microelectronic devices for a variety of reasons. For example, in some embodiments, silicon nitride may be used as a dielectric to prevent an electrical connection between two materials. In addition or alternatively, silicon nitride may be used as an etch stop or polish stop. In some cases, silicon nitride may be used as a diffusion barrier to prevent impurities within one layer from diffusing into other layers of a microelectronic device. In yet other cases, silicon nitride may be used to prevent impurities external to the microelectronic device from affecting the device. In any case, a common technique for fabricating a silicon nitride layer within microelectronic devices is to generate a plasma of silane ($SiH_4$) and ammonia ($NH_3$) and expose a microelectronic topography to such a plasma. In general, such a process is conducted at a temperature equal to or greater than approximately 400° C. In some cases, however, fabricating a silicon nitride layer at such a temperature may undesirably affect the operation of a device. For example, a device having magnetic structures may be undesirably affected by a processing temperature greater than approximately 300° C. or, more specifically, greater than approximately 250° C., in some cases. In particular, a relatively high temperature may alter the magnetic direction or the strength of magnetization within the magnetic layers of a device. In some embodiments, such a high processing temperature may cause individual magnetic layers within a structure to interdiffuse, causing the properties of the magnetic layer to change or render the magnetic layers non-magnetic.

Consequently, in some cases, the deposition technique described above is conducted at a temperature that is less than or equal to approximately 300° C. Conducting the deposition technique at such a relatively low temperature, however, typically results in a high concentration of diatomic hydrogen molecules within the deposited film. Such diatomic hydrogen molecules may he susceptible to moving within the layer upon the application of heat during subsequent processing. In general, the movement of diatomic hydrogen within a layer will cause the atomic structure within the layer to change, causing a stress change within the layer. The magnitude of such a stress change may be dependent on the concentration of diatomic hydrogen molecules within the layer, the temperatures to which the layer is exposed, and the duration for which the layer is exposed to high temperatures. As such, in cases in which a relatively high concentration of diatomic hydrogen exists, the potential for a particularly large stress change may be imminent. In some cases, the stress change may be so severe that the layer cracks, exposing underlying portions of the topography and/or rendering the topography to be susceptible to the introduction or diffusion of impurities within the topography.

Therefore, it may be advantageous to develop a method which deposits a silicon nitride layer at a relatively low temperature without forming a substantially high concentration of diatomic hydrogen molecules within the layer. Such a method may be particularly beneficial for controlling the degree of stress change within the layer during subsequent processing.

SUMMARY OF THE INVENTION

The problems outlined above may be in large part addressed by a method which deposits a silicon nitride layer from a plasma generated from diatomic nitrogen gas. More specifically, the method may include creating a plasma from a gas mixture which includes diatomic nitrogen gas and a gas comprising silicon. In some embodiments, the ratio of diatomic nitrogen gas to silicon-containing gas within the mixture may be between approximately 0.5:1 and approximately 10:1. Larger or smaller ratios of the gases, however, may be used for the method described herein, depending of the parameters of the deposition process. In any case, the method may further include exposing a microelectronic topography to the plasma to form a silicon nitride layer thereon. In general, the microelectronic topography may include any microelectronic topography, including those topographies that include structures for semiconductor devices and/or magnetic devices.

In some cases, the silicon nitride layer may serve as a passivation layer for the topography of the microelectronic topography. Alternatively, the silicon nitride layer may serve a different function within the topography of the microelectronic topography, such as a dielectric layer, etch stop layer, and/or polish stop layer, for example. In some cases, the method may further include depositing a silicon dioxide layer upon the microelectronic topography prior to the deposition of the silicon nitride layer. In such an embodiment, the deposition of the silicon dioxide layer may be conducted within the same reaction chamber as the deposition of the silicon nitride layer. In other embodiments, however, the deposition of the silicon dioxide layer may be conducted in a different reaction chamber than used for the deposition of the silicon nitride layer. In either case, the method may be conducted in a high density plasma reaction chamber, in some embodiments. Alternatively, the method may be conducted in other types of plasma reaction chambers.

In some embodiments, it may be advantageous to deposit the silicon nitride layer at a temperature less than or equal to approximately 300° C., or more specifically, between approximately 200° C. and approximately 250° C. In particular, it may be advantageous to deposit the silicon nitride layer at a relatively low temperature in order to minimize the generation of diatomic hydrogen molecules with the silicon nitride layer. In other cases, however, the deposition of the silicon nitride layer may be conducted at a temperature greater than approximately 300° C. In general, a layer has a certain amount of stress upon deposition. The stress within the layer may be altered, however, by subsequent processing of the topography on which the layer is formed. For example, heating a silicon nitride layer may cause movement of diatomic hydrogen molecules arranged within the layer, causing a stress change within the layer.

The deposition technique described herein, however, may form a relatively low concentration of diatomic hydrogen molecules within a silicon nitride layer. In particular, the deposition technique may create a silicon nitride layer having a concentration of diatomic hydrogen that is at least one order of magnitude lower than a concentration of diatomic hydrogen within a silicon nitride layer alternatively formed from a plasma generated from ammonia. Such a difference in the generation of diatomic hydrogen molecules within silicon nitride layers of the two distinct techniques may be even larger when the deposition methods have both been conducted at a temperature less than or equal to approximately 300° C. For example, in some cases, the concentration of diatomic hydrogen within the silicon nitride layer formed using the method described herein may be at least three orders of magnitude lower than the concentration of diatomic hydrogen within a silicon nitride layer formed from a plasma generated from ammonia.

In any case, the method may further include processing the microelectronic topography at a temperature greater than or equal to approximately 250° C. subsequent to the deposition of the silicon nitride layer. Such a step of subsequently processing the microelectronic topography may produce a stress change of less than approximately $1.0 \times 10^{10}$ dynes/Cm$^2$ within the silicon nitride layer. In other words, the method may include heating the microelectronic topography such that a stress change of less than approximately $1.0 \times 10^{10}$ dynes/cm$^2$ is induced within the silicon nitride layer. In some cases, the stress change is less than approximately $1.0 \times 10^9$ dynes/cm$^2$, or more specifically, less than approximately $2.0 \times 10^8$ dynes/cm$^2$. In any case, the stress change may be directed toward either a tensile stress condition or a compressive stress condition within the silicon nitride layer.

In general, the step of subsequently processing the microelectronic topography may include any processes which are conducted at a temperature greater than approximately 250° C., including processes within the fabrication or assembly of the microelectronic topography. For example, the step of subsequently processing the microelectronic topography may include annealing the microelectronic topography. In addition or alternatively, the step of subsequently processing the microelectronic topography may include depositions of other layers and/or etching layers of the microelectronic topography. As such, in some embodiments, the steps of subsequently processing the microelectronic topography may include a plurality of processes conducted at temperature greater than approximately 250° C. subsequent to the step of forming the silicon nitride layer. In other embodiments, however, the step of subsequently processing the microelectronic topography may include only a single processing step.

There may be several advantages to fabricating a silicon nitride layer using the method described herein. In particular, the method may generate a relatively low concentration of diatomic hydrogen molecules within the silicon nitride layer upon deposition. In turn, the layer may undergo a relatively small degree of stress change during subsequent processing of the topography including the silicon nitride layer. Consequently, a silicon nitride layer deposited using the method described herein may be less prone to crack. Therefore, a topography including a silicon nitride layer deposited by the method described herein may be less susceptible to the introduction or diffusion of impurities within the topography.

BRIEF DESCRIPTION OF THE DRAWINGS

Other objects and advantages of the invention will become apparent upon reading the following detailed description and upon reference to the accompanying drawings in which:

FIG. 1 depicts a flowchart outlining a method for depositing a silicon nitride layer; and FIG. 2 depicts a cross-sectional view of an exemplary deposition chamber.

While the invention may include various modifications and alternative forms, specific embodiments thereof are shown by way of example in the drawings and will herein be described in detail. It should be understood, however, that the drawings and detailed description thereto arc not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning to the drawings, a flowchart of a method for depositing a silicon nitride layer is depicted in FIG. 1. In particular, FIG. 1 includes step 10 which includes creating a plasma from a gas mixture including diatomic nitrogen gas and a gas comprising silicon. The method further includes step 12 in which a microelectronic topography is exposed to the plasma to form a silicon nitride layer thereon. Moreover, the method may include step 14 in which the microelectronic topography is subsequently processed such that a stress change of less than approximately $1.0 \times 10^{10}$ dynes/cm$^2$ is induced within the silicon nitride layer. In general, a silicon nitride layer deposited using the method described herein may serve a variety of purposes. For example, the silicon nitride layer may serve as a polish stop layer, etch stop layer, dielectric layer, diffusion barrier, and/or passivation layer. In addition, a silicon nitride layer deposited using the method described herein may be fabricated within any microelectronic device. In particular, the method may be used for the fabrication of silicon nitride layers within devices comprising semiconductor materials and/or magnetic materials. In some cases, it may be particularly advantageous to use the method described herein in the fabrication of a magnetic random access memory (MRAM) device, since the method may be used at relatively low temperatures. In particular, depositing a silicon nitride layer using the method described herein may advantageously process an MRAM topography such that the magnetic properties of the layers of the topography are not altered.

The method is described in more detail below with regard to the operations of the plasma deposition chamber illustrated in FIG. 2. AS such, the method described herein, may include any of the limitations or adaptions described in reference to the operations of the plasma deposition chamber illustrated in FIG. 2. In general, FIG. 2 illustrates an exemplary cross-sectional view of chamber 300 including an ionizing element and pedestal 306. As shown in FIG. 2, the ionizing element may be arranged exterior to deposition chamber 300. In particular, the ionizing element may include induction coil 320 mounted near or on sidewalls 310 of the chamber. Induction coil 320 may turn around the chamber any number of times. Preferably, the ionizing element may be adapted to ionize at least a portion of the gas atoms within chamber 300. In particular, induction coil 320 may be coupled to power supply 318 such that a plasma within chamber 300 may be formed. In general, power supply 318 may include any energy source, such as a DC power supply source, an AC power supply source, a radio frequency (FC) power source, and/or a microwave source. In any case, the power applied to induction coil 320 may be less than approximately 2.5 kW. More specifically, the power applied to induction coil 320, maybe between approximately 1.0 kW and approximately 5.0 kW, more preferably about 2.5 kW.

In some cases, such an ionization of gas atoms may produce a high density plasma within chamber 300. A "high density plasma," as used herein, may refer to a plasma having an electron density greater than approximately $1.0 \times 10^{12}$ cm$^{-3}$. However, it is noted that the method described herein is not restricted to the use of high density plasmas. On the contrary, the method described herein may be conducted with the use of low, medium, or high density plasmas. A "medium density plasma," as used herein, may refer to a plasma having an electron density between approximately $1.0 \times 10^8$ cm$^{-3}$ and approximately $1.0 \times 10^{12}$ cm$^{-3}$, while a "low density plasma" may refer to a plasma having an electron density less than approximately $1.0 \times 10^8$ cm$^{-3}$.

As shown in FIG. 2, pedestal 306 may be located near the bottom of chamber 300 and may be adapted for supporting and retaining microelectronic topography 200 during processing. In some cases, pedestal 306 may be moveable such that the distance between microelectronic topography 200 and gas inlet 312 may be adjusted. In such an embodiment, the distance set between microelectronic topography 200 and gas inlet 312 may depend on the design specifications of the deposited layer and the process parameters of the deposition process. In addition, pedestal 306 may be configured as an electrostatic or mechanical chuck. In yet other embodiments, pedestal 306 may be a fixed platform. In either case, pedestal 306 may be adapted to control the temperature of the topography during the deposition process. In particular, pedestal 306 may, in some embodiments, include a means for heating and/or cooling microelectronic topography 200.

In some embodiments, heating a microelectronic topography to relatively high temperatures may adversely affect the properties of the layers arranged therein. For example, a device having magnetic layers may be affected by a processing temperature greater than approximately 350° C. or, more specifically, greater than approximately 300° C., in some cases. In particular, a relatively high temperature may alter the magnetic direction or the strength of magnetization within magnetic layers of a device. In some embodiments, such a high processing temperature may cause individual magnetic layers within a structure to interdiffuse, causing the properties of the magnetic layers to change or render the magnetic layers non-magnetic. As such, it may be advantageous to deposit the silicon nitride layer at a relatively low temperature in order to minimize the generation of diatomic hydrogen molecules with the silicon nitride layer. For example, in some embodiments, the deposition process described herein may be conducted with the microelectronic topography at a temperature that is less than approximately 300° C. In some cases, the microelectronic topography may be maintained at a temperature that is between approximately 200° C. and approximately 250° C. In other cases, however, the deposition of the silicon nitride layer may be conducted at a temperature greater than approximately 300° C. More specifically, the deposition of the silicon nitride layer may generally be conducted at a temperature between approximately 200° C. and approximately 425° C.

In any case, power supply 322 may be operably coupled to pedestal 306. In general, power supply 322 may be configured to supply a bias power to pedestal 306 for drawing ionized atoms toward pedestal 306, and thus toward the surface of microelectronic topography 200, at an approximately perpendicular angle. In general, power supply 322 may include any energy source, such as a DC power supply source, an AC power supply source, an RF power source, and/or a microwave power source. Once a plasma is formed within chamber 300, a high electric field, or self bias, may develop between the plasma and microelectronic topography 200. The high electric field may accelerate and collimate the ions at the surface of microelectronic topography 200. The bias applied to the pedestal 306, and thus to microelectronic topography 200, can control the field strength of the high electric field. In some cases, the bias power applied to pedestal 306 may be between approximately 50 W and approximately 500 W, or more preferably at about 200 W.

In general, the plasma used to deposit the silicon nitride layer may be generated within chamber 300 from the introduction of gas supply 314. In a preferred embodiment, gas supply 314 may include a gas mixture including diatomic nitrogen and a gas comprising silicon, such as silane, for example. In some embodiments, gas supply 314 may further include one or more inert gases to dilute the reactionary gases of gas supply 314. In any case, the ratio of diatomic nitrogen gas to silicon-containing gas within the mixture may be between approximately 0.5:1 and approximately 10:1, or more specifically about 1:1. Larger or smaller ratios of the gases, however, may be used for the method described herein, depending of the parameters of the deposition process and/or the design specifications of the device. In addition, the thickness of the silicon nitride layer using the method described herein may depend on the design specifications of the device and/or the sequence of the fabrication process. In general, however, the thickness of the silicon nitride layer formed using the method described herein may be between approximately 100 angstroms and approximately 2 microns.

The use of diatomic nitrogen within gas supply 314 may advantageously form a relatively low concentration of diatomic hydrogen molecules within the deposited silicon nitride layer. In particular, generating a plasma from a gas mixture comprising diatomic nitrogen gas may create a silicon nitride layer having a concentration of diatomic hydrogen that is at least one order of magnitude lower than a concentration of diatomic hydrogen within a silicon nitride layer formed from a plasma generated from ammonia. Such a difference in the generation of diatomic hydrogen molecules within silicon nitride layers of the two distinct techniques may be even larger when both deposition methods have been conducted at a temperature less than or equal to approximately 300° C. For example, in some cases, the concentration of diatomic hydrogen within a silicon nitride layer formed a plasma generated from diatomic nitrogen gas may be at least three orders of magnitude lower than the concentration of diatomic hydrogen within a silicon nitride layer formed from a plasma generated from ammonia. Such a reduction in the generation of diatomic hydrogen molecules may advantageously reduce the stress change within the layer during subsequent processing as discussed in more detail below.

In any case, gas supply 314 may be supplied to deposition chamber 300 through gas inlet 312. In some cases, gas supply 314 may be supplied to deposition chamber 300 through a plurality of gas inlets. In yet other embodiments, the method may include supplying one or more of the gases used to create the plasma within deposition chamber 300 through separate gas inlets. In other words, the method may include feeding diatomic nitrogen gas and a gas comprising silicon in different gas inlets such that the gas mixture is formed within deposition chamber 300. In addition, the flow rate of the gas into deposition chamber 300 may vary depending on design specifications of the device and/or the process parameters of the deposition process. In general, however, the flow rate of the gas from gas supply 314 into deposition chamber 300 may be between approximately 5.0 standard cubic centimeters per minute (sccm) and approximately 1000 sccm, more preferably between approximately 100 sccm and approximately 400 sccm.

As shown in FIG. 2, deposition chamber 300 may include gas outlets 313 with which to release exhaust gases from the deposition process. Gas outlets 313 may be connected to a pumping system (not shown) including one or more vacuum pumps. In general, the pumping system may be adapted to maintain a desired level of pressure within the chamber. For example, the vacuum pumps may be configured to create a pressure between approximately 1 mTorr and approximately 5 Torr within deposition chamber 300. Larger or smaller levels of pressure may be created within deposition chamber 300, depending on the process parameters of the deposition process. Although two gas outlets are shown in FIG. 2, any number of gas outlets may be arranged within deposition chamber 300.

In some cases, the method may further include depositing a silicon dioxide layer upon the microelectronic topography prior to the deposition of the silicon nitride layer. In some cases, such a silicon dioxide layer may serve as a "pad" oxide layer to reduce the inherent stresses between the silicon nitride layer and microelectronic topography 200. Typically, the pad oxide layer may include a thickness between approximately 15 angstroms and approximately 3 microns. In some cases, the deposition of the silicon dioxide layer may be conducted within the same reaction chamber as the deposition of the silicon nitride layer. More specifically, the deposition of a silicon dioxide layer upon microelectronic topography 200 may be conducted within deposition chamber 300 prior to the deposition of the silicon nitride layer in chamber 300 as described above. Allowing both depositions to occur within the same chamber may advantageously reduce the overall fabrication time of the microelectronic device, thereby increasing production throughput. In other embodiments, however, the deposition of the silicon dioxide layer may be conducted in a different reaction chamber than the chamber used for the deposition of the silicon nitride layer. In either case, the deposition of the silicon dioxide layer may be conducted with a high density plasma with a silane source gas, in some embodiments. The use of such a deposition technique may advantageously prevent the formation of voids within the silicon dioxide layer. Consequently, a contiguous dielectric layer may be formed with such a process. In yet other embodiments, however, the deposition of the silicon dioxide layer may be formed with a medium or low density plasma. In addition or alternatively, the source gas for the deposition of the silicon dioxide layer may be tetraethylorthosilicate (TEOS).

In any case, the method may further include processing the microelectronic topography at a temperature greater than or equal to approximately 250° C. subsequent to the deposition of the silicon nitride layer. Such subsequent processing may include any steps of the fabrication and/or assembly process of the microelectronic topography. For example, the step of subsequently processing the microelectronic topography may include annealing the microelectronic topography. In addition or alternatively, the step of subsequently processing the microelectronic topography may include depositing and/or etching other layers of the microelectronic topography. As such, in some embodiments, the steps of subsequently processing the microelectronic topography may include a plurality of processes conducted at temperatures greater than approximately 250° C. subsequent to the step of forming the silicon nitride layer. In other embodiments, however, the step of subsequently processing the microelectronic topography may include only a single processing step.

In any case, such an exposure of heat may produce a stress change within the deposited nitride layer. For example, the method may include heating the microelectronic topography such that a stress change of less than approximately $1.0 \times 10^{10}$ dynes/cm$^2$ is induced within the silicon nitride layer. In some cases, the stress change is less than approximately $1.0 \times 10^9$ dynes/cm$^2$, or more specifically, less than approximately $2.0 \times 10^8$ dynes/cm$^2$. In general, a layer has a certain amount of stress upon deposition. The stress within the layer may be altered, however, by subsequent processing of the topography on which the layer is formed. For example, heating a silicon nitride layer may cause movement of diatomic hydrogen molecules arranged within the layer, causing a stress change within the layer. The method described herein, however, advantageously forms a relatively low amount of diatomic hydrogen molecules within a silicon nitride layer upon deposition. In this manner, the stress change within the layer during subsequent processing may be reduced relative to conventional devices in which silicon nitride layers are deposited by a plasma generated from ammonia. Consequently, the silicon nitride layer deposited by the method described herein may be less prone to cracking and, therefore, less prone to allowing the diffusion or the introduction of impurities within other layers of the microelectronic topography.

It is noted that the stress change within a silicon nitride layer deposited using the method described herein may be directed toward either a tensile stress condition or a compressive stress condition. "Tensile stress" and "compressive stress," as used herein, may refer to the force per unit area with a layer that causes the layer to bend toward or away from an underlying layer, respectively. In general, a layer may be deposited with stress formed in either the tensile or compressive direction. Similarly, a stress change in the layer may be directed toward either of the directions. As such, the nature of the stress within a layer may be enhanced or counteracted. More specifically, a layer deposited with stress in the tensile direction may, in some embodiments, experience a stress change directed further in the tensile direction. Alternatively, the layer may experience a stress change directed in the compressive direction. A similar layer deposited in the compressive direction may similarly experience such changes in stress.

It will be appreciated to those skilled in the art having the benefit of this disclosure that this invention is believed to provide a method for depositing a silicon nitride layer. Further modifications and alternative embodiments of various aspects of the invention will be apparent to those skilled in the art in view of this description. For example, although the benefits of such a deposition technique is specifically described in reference to the fabrication of microelectronic devices which include magnetic materials, the method may be used for the deposition of a silicon nitride layer in any microelectronic device application. In addition, although the deposition technique has been described in reference to using an electrode and a coil to generate a high density plasma, other plasma generators, such as electron cyclotron resonance (ECR) generators and inductively coupled plasma (ICP) generators may be used in the method described herein. It is intended that the following claims be interpreted to embrace all such modifications and changes and, accordingly, the specification and drawings are to be regarded in an illustrative rather than a restrictive sense.

What is claimed is:

1. A method, comprising:
   creating a plasma from a mixture comprising diatomic nitrogen gas and a gas comprising silicon; and exposing a microelectronic topography to the plasma to form a silicon nitride layer thereon, wherein the steps of creating the plasma and exposing the microelectronic topography are conducted at a temperature less than or equal to approximately 300° C.

2. The method of claim 1, wherein the steps of creating the plasma and exposing the microelectronic topography are conducted at a temperature between approximately 200° C. and approximately 250° C.

3. The method of claim 1, wherein the steps of creating the plasma and exposing the microelectronic topography are conducted in a high density plasma reaction chamber.

4. The method of claim 3, further comprising depositing a silicon dioxide layer upon the microelectronic topography and within the high density plasma reaction chamber prior to the step of creating the plasma from the mixture comprising diatomic nitrogen gas and a gas comprising silicon.

5. The method of claim 1, further comprising heating the microelectronic topography such that a stress change of less than approximately $1.0 \times 10^{10}$ dyne/cm$^2$ is induced within the silicon nitride layer.

6. The method of claim 1, wherein the step of exposing the microelectronic topography comprises forming a passivation layer upon the microelectronic topography.

7. The method of claim 1, wherein the mixture comprises a ratio of diatomic nitrogen gas to silicon-containing gas between approximately 0.5:1 and approximately 10:1.

8. The method of claim 1, wherein the microelectronic topography comprises a magnetic random access memory array configuration.

9. A method, comprising:
  forming a silicon nitride layer upon a microelectronic topography at a temperature less than or equal to approximately 300° C.; and
  subsequently processing the microelectronic topography at a temperature greater than or equal to approximately 250° C., wherein the step of subsequently processing the microelectronic topography produces a stress change of less than approximately $1.0 \times 10^{10}$ dynes/cm$^2$ within the silicon nitride layer.

10. The method of claim 9, wherein the stress change is less than approximately $1.0 \times 10^9$ dynes/cm$^2$.

11. The method of claim 10, wherein the stress change is less than approximately $2.0 \times 10^8$ dynes/cm$^2$.

12. The method of claim 9, wherein the step of subsequently processing the microelectronic topography comprises annealing the microelectronic topography.

13. The method of claim 9, wherein the step of subsequently processing the microelectronic topography comprises a plurality of processes conducted at temperatures greater than approximately 250° C. subsequent to the step of forming the silicon nitride layer.

14. The method of claim 9, wherein the step of forming the silicon nitride layer comprises generating a plasma from a mixture comprising diatomic nitrogen gas.

15. The method of claim 9, wherein the stress change is directed toward a tensile stress condition within the silicon nitride layer.

16. The method of claim 9, wherein the stress change is directed toward a compressive stress condition within the silicon nitride layer.

17. The method of claim 9, wherein the step of forming the silicon nitride layer is conducted within a high density plasma reaction chamber.

18. A method, comprising;
  depositing a silicon dioxide layer upon a microelectronic topography within a high density plasma reaction chamber; and
  depositing a silicon nitride layer above the silicon dioxide layer within the high density plasma reaction chamber using a plasma comprising diatomic nitrogen gas and a gas comprising silicon.

19. The method of claim 18, wherein the stop of depositing the silicon nitride layer is conducted at a temperature less than or equal to approximately 300° C.

20. The method of claim 18, further comprising processing the microelectronic topography subsequent to the step of depositing the silicon nitride layer such that a stress change of less than approximately $1.0 \times 10^{10}$ dynes/cm$^2$ is induced within th silicon nitride layer.

\* \* \* \* \*

UNITED STATES PATENT AND TRADEMARK OFFICE
CERTIFICATE OF CORRECTION

PATENT NO. : 6,811,831 B1
DATED : November 2, 2004
INVENTOR(S) : Koutny et al.

It is certified that error appears in the above-identified patent and that said Letters Patent is hereby corrected as shown below:

<u>Title page,</u>
Item [74], *Attorney, Agent, or Firm,* please delete "Kevin I. Daffer" and substitute therefor -- Kevin L. Daffer --.

<u>Column 9,</u>
Line 20, please delete "dyne/cm$^2$" and substitute therefor -- dynes/cm$^2$ --.

<u>Column 10,</u>
Line 41, please delete "th" and subtitute therefor -- the --.

Signed and Sealed this

Fifth Day of April, 2005

JON W. DUDAS
*Director of the United States Patent and Trademark Office*